US011749547B2

(12) United States Patent
Yoshida et al.

(10) Patent No.: US 11,749,547 B2
(45) Date of Patent: Sep. 5, 2023

(54) SUBSTRATE TRANSFER APPARATUS AND SUBSTRATE PLACEMENT PORTION ROTATION AXIS SEARCHING METHOD

(71) Applicant: KAWASAKI JUKOGYO KABUSHIKI KAISHA, Kobe (JP)

(72) Inventors: Masaya Yoshida, Himeji (JP); Kenji Noguchi, Kobe (JP); Hiroyuki Okada, Kakogawa (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 792 days.

(21) Appl. No.: 16/652,160

(22) PCT Filed: Jul. 30, 2018

(86) PCT No.: PCT/JP2018/028451
§ 371 (c)(1),
(2) Date: Mar. 30, 2020

(87) PCT Pub. No.: WO2019/064890
PCT Pub. Date: Apr. 4, 2019

(65) Prior Publication Data
US 2020/0243362 A1    Jul. 30, 2020

(30) Foreign Application Priority Data

Sep. 29, 2017    (JP) .................................. 2017-191618

(51) Int. Cl.
*H01L 21/677* (2006.01)
*B65G 47/90* (2006.01)
(Continued)

(52) U.S. Cl.
CPC ........ *H01L 21/67706* (2013.01); *B25J 13/08* (2013.01); *B65G 47/90* (2013.01);
(Continued)

(58) Field of Classification Search
CPC ......... H01L 21/67706; H01L 21/67259; H01L 21/68; H01L 21/67742; H01L 21/67748;
(Continued)

(56) References Cited

U.S. PATENT DOCUMENTS

2002/0171847 A1* 11/2002 Fukumoto .......... G01B 11/2518
356/606
2014/0107825 A1* 4/2014 Kubodera ......... H01L 21/67766
700/112

FOREIGN PATENT DOCUMENTS

JP    2005-310858 A    11/2005
JP    2014-099576 A    5/2014

* cited by examiner

*Primary Examiner* — Thomas C Lee
*Assistant Examiner* — Michael Tang
(74) *Attorney, Agent, or Firm* — Oliff PLC

(57) ABSTRACT

A target provided to a substrate placement portion is detected by an object detection sensor at a plurality of rotation positions of the substrate placement portion. An index length which is a distance from a robot reference axis to the target in a direction perpendicular to an axial direction, or information correlated therewith, is calculated. At least one of a rotation position of a detection line about the robot reference axis and a rotation position of the substrate placement portion about a rotation axis when the target located on a line connecting the robot reference axis and the rotation axis is detected is calculated on the basis of the calculated index length or the calculated information correlated therewith. A direction in which the rotation axis is present as seen from the robot reference axis is specified on the basis of the calculated rotation position.

14 Claims, 10 Drawing Sheets

(51) Int. Cl.
  *H01L 21/67*    (2006.01)
  *H01L 21/68*    (2006.01)
  *G05B 19/402*   (2006.01)
  *B25J 13/08*    (2006.01)

(52) U.S. Cl.
  CPC ...... *G05B 19/402* (2013.01); *H01L 21/67259* (2013.01); *H01L 21/68* (2013.01); *G05B 2219/37608* (2013.01)

(58) Field of Classification Search
  CPC .... H01L 21/68764; B25J 13/08; B65G 47/90; B65G 47/904; B65G 49/061; B65G 49/064; B65G 2201/022; G05B 19/402; G05B 2219/37608
  USPC .................................................. 700/112, 114
  See application file for complete search history.

SUBSTRATE TRANSFER APPARATUS AND SUBSTRATE PLACEMENT PORTION ROTATION AXIS SEARCHING METHOD

TECHNICAL FIELD

The present invention relates to technology for transferring a substrate such as a semiconductor substrate or a glass substrate.

BACKGROUND ART

Conventionally, in a semiconductor process, a substrate placement portion on which a plurality of semiconductor substrates can be placed in an aligned state is used for performing processing for the plurality of semiconductor substrates collectively. In general, such a substrate placement portion includes a pair of plate members separated from each other and a plurality of support columns extended between the pair of plate members. Each support column has a plurality of support grooves provided at a constant pitch in the axial direction of the support column. A peripheral portion of a substrate is fitted into the support grooves, whereby the substrate is supported by the support columns.

A substrate transfer robot is used for transferring a substrate onto/from the above-described substrate placement portion. In general, the substrate transfer robot includes a robot arm, a substrate transfer hand mounted to an end of the robot arm, and a controller. The substrate transfer hand has a substrate holding portion for holding a substrate, and the substrate can be held by being sucked or grasped, for example. PTL 1 exemplifies a substrate transfer hand which has a plate-shaped blade with an end forked in a Y shape and transfers the substrate placed on the blade.

In the substrate transfer robot described in PTL 1, a light emitting portion is attached to one of both forked ends of the substrate transfer hand, and a light receiving portion is attached to the other end so as to be opposed to the light emitting portion. The light emitting portion and the light receiving portion form a transmission-type photo-sensor, and the transmission-type photo-sensor can detect an object obstructing the optical axis. An external teaching jig attached to a front outer wall of a substrate processing device is detected by the transmission-type photo-sensor, whereby, using the relative positional relationship between the center of the known taught position inside the substrate processing device and the center of an external taught position, the relative positional relationship between the substrate transfer apparatus and the center of the taught position is estimated.

CITATION LIST

Patent Literature

PTL 1: Japanese Laid-Open Patent Publication No. 2005-310858

SUMMARY OF INVENTION

Technical Problem

Some substrate placement portions are configured to be placed and fixed on a turntable and rotate integrally with the turntable. On such a substrate placement portion, a substrate is placed such that the rotation axis of the substrate placement portion and the center of the substrate coincide with each other. Therefore, an operator operates a teaching pendant while visually confirming the substrate transfer robot and the substrate placement portion, thereby teaching the substrate transfer robot the substrate placement position so that the rotation axis of the substrate placement portion and the center of the substrate coincide with each other. However, such a teaching operation is an extremely complicated operation, and thus technology for automatically and precisely teaching the substrate transfer robot the placement position on the substrate placement portion is desired.

Since a substrate has a predetermined round shape, it is possible to easily derive the substrate placement position on the substrate placement position on the basis of the position of the rotation axis of the substrate placement portion. Accordingly, an object of the present invention is to provide technology for searching for the position of the rotation axis that is the center of rotation of a substrate placement portion by a substrate transfer robot.

Solution to Problem

A substrate placement portion rotation axis searching method according to one aspect of the present invention is a method for searching for a rotation axis of a substrate placement portion configured to rotate about the rotation axis, by using a substrate transfer robot provided with a robot reference axis, the substrate transfer robot having an object detection sensor for detecting an object obstructing a detection line, and a robot arm for moving the object detection sensor in a plane perpendicular to an axial direction of the robot reference axis, the rotation axis extending in parallel to the axial direction, the method including the steps of: detecting a target provided to the substrate placement portion by the object detection sensor at a plurality of rotation positions of the substrate placement portion, and calculating an index length which is a distance from the robot reference axis to the target in a direction perpendicular to the axial direction, or information correlated therewith; on the basis of the calculated index length or the calculated information correlated therewith, calculating at least one of a rotation position of the detection line about the robot reference axis and a rotation position of the substrate placement portion about the rotation axis when the target located on a line connecting the robot reference axis and the rotation axis is detected; and specifying a direction in which the rotation axis is present as seen from the robot reference axis, on the basis of the calculated rotation position.

A substrate transfer apparatus according to one aspect of the present invention includes: a substrate transfer robot provided with a robot reference axis and having an object detection sensor for detecting an object obstructing a detection line, and a robot arm for moving the object detection sensor in a plane perpendicular to an axial direction of the robot reference axis; a substrate placement portion having a target to be detected by the object detection sensor, the substrate placement portion being configured to rotate about a rotation axis extending in parallel to the axial direction; and a controller configured to control operations of the substrate transfer robot and the substrate placement portion. The controller detects the target by the object detection sensor at a plurality of rotation positions of the substrate placement portion, and calculates an index length which is a distance from the robot reference axis to the target in a direction perpendicular to the axial direction, or information correlated therewith. On the basis of the calculated index length or the calculated information correlated therewith, the controller calculates at least one of a rotation position of the detection line about the robot reference axis and a rotation position of the substrate placement portion about the rotation axis when the target located on a line connecting the robot reference axis and the rotation axis is detected. The controller specifies a direction in which the rotation axis is present as seen from the robot reference axis, on the basis of the calculated rotation position.

With the substrate placement portion rotation axis searching method and the substrate transfer apparatus described above, it is possible to specify the direction in which the rotation axis is present as seen from the robot reference axis, on the basis of the rotation position of the detection line about the robot reference axis when the target located on the line connecting the robot reference axis and the rotation axis is detected. It is noted that, if the rotation position of the rotation axis when the target located on the line connecting the robot reference axis and the rotation axis is detected is found, the rotation position of the detection line about the robot reference axis can be calculated through searching by using the rotation position. Then, by the substrate transfer robot automatically performing the above operation, it becomes possible to automatically teach the substrate transfer robot the direction toward the rotation axis relative to the robot reference axis.

Advantageous Effects of Invention

The present invention can realize technology for searching for the rotation axis that is the center of rotation of the substrate placement portion by the substrate transfer robot.

DESCRIPTION OF EMBODIMENTS

[Schematic Structure of Substrate Transfer Apparatus 10]

Figure 1:
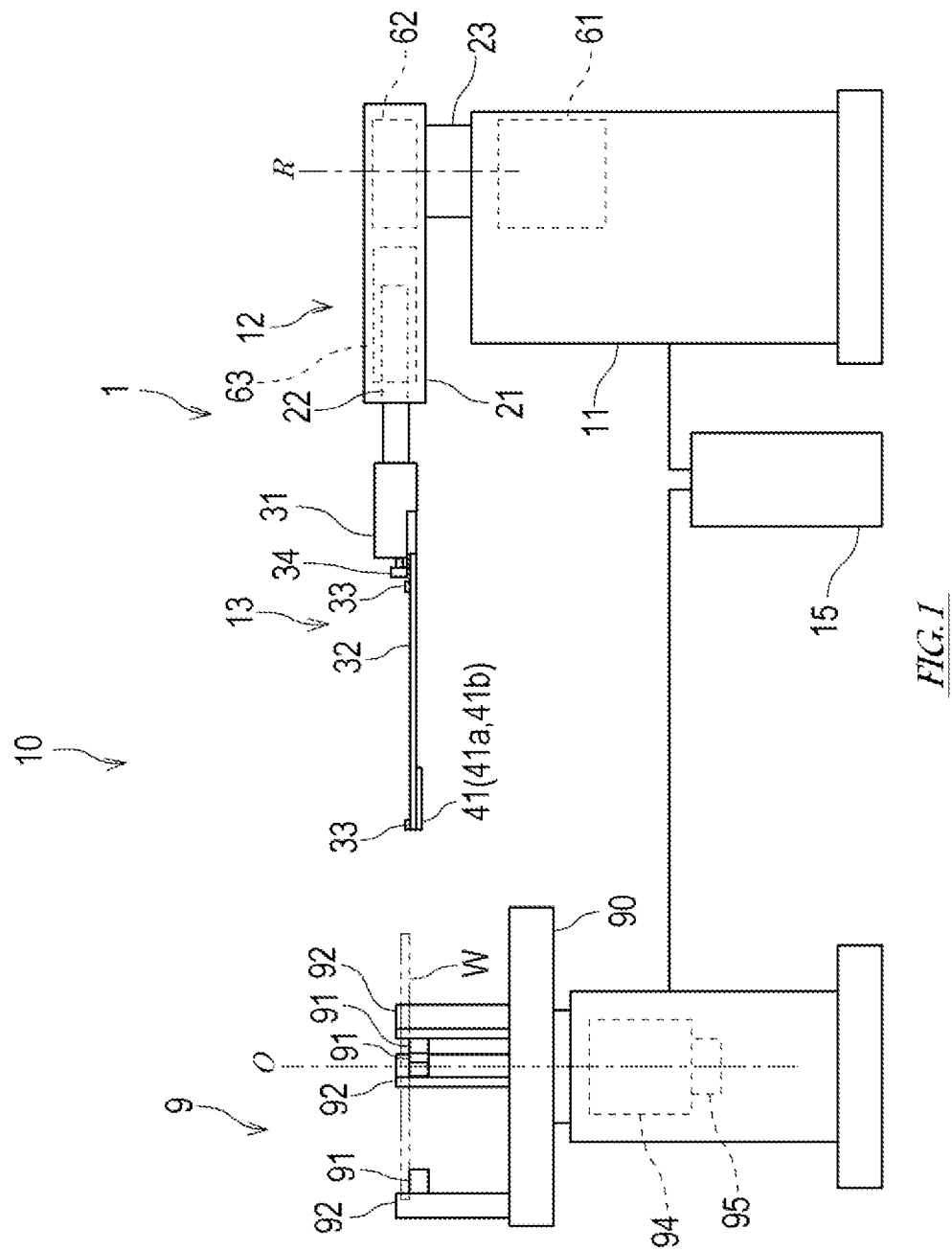
FIG. 1 is a schematic side view of a substrate transfer apparatus according to an embodiment of the present invention.
Figure 2:
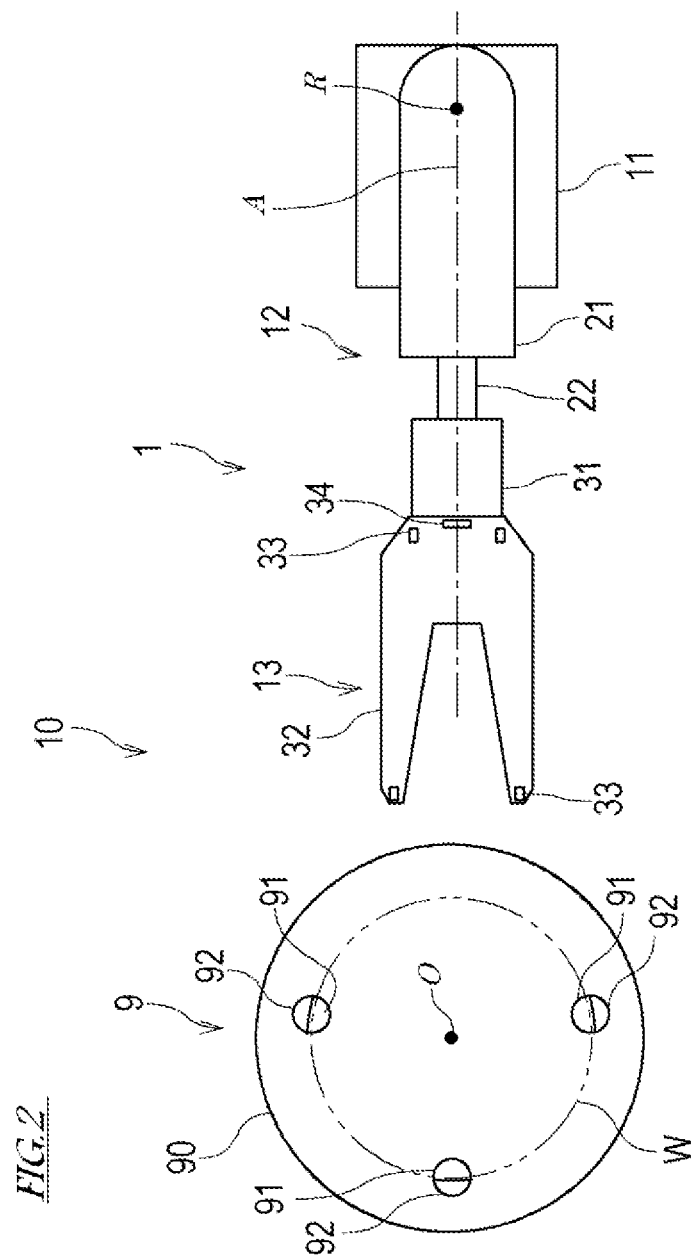
FIG. 2 is a schematic plan view of the substrate transfer apparatus.

Hereinafter, embodiments of the present invention will be described with reference to the drawings. FIG. 1 is a schematic side view of a substrate transfer apparatus 10 according to an embodiment of the present invention, and FIG. 2 is a schematic plan view of the substrate transfer apparatus 10. The substrate transfer apparatus 10 shown in FIG. 1 and FIG. 2 includes a substrate placement portion 9 on which a substrate W is to be placed, a substrate transfer robot 1 for transferring (placing) the substrate W onto/from the substrate placement portion 9, and a controller 15 for controlling operations of the substrate transfer robot 1 and the substrate placement portion 9. The substrate transfer apparatus 10 may be applied to various types of systems for transferring the substrate W, e.g., an EFEM (Equipment Front End Module), a sorter, and a substrate processing system.

[Structure of Substrate Placement Portion 9]

The substrate placement portion 9 according to the present embodiment is provided with a plurality of (three or more) support columns 92 arranged on the same circumference. On each support column 92, one or a plurality of support portions 91 are formed. The plurality of support columns 92 have the corresponding support portions 91 located on substantially the same plane. The edge of one substrate W is supported by the corresponding plurality of support portions 91. Each support portion 91 is, for example, a groove formed in the support column 92 or a protrusion protruding in the horizontal direction from the support column 92, and thus forms an upward surface for supporting the edge of the substrate W from below.

The substrate placement portion 9 is supported by a turntable 90 and rotates about a rotation axis O. The center of the substrate W placed on the substrate placement portion 9 and the center of the circumference formed by the plurality of support columns 92 (or plurality of support portions 91) are located on an extension line of the rotation axis O. The substrate placement portion 9 is detachably supported on the turntable 90. However, the substrate placement portion 9 and the turntable 90 may be formed integrally. The turntable 90 is provided with a turntable driving device 94 formed from a servomotor or the like, and a rotation position detector 95 for detecting the rotation position of the turntable 90.

[Structure of Substrate Transfer Robot 1]

The substrate transfer robot 1 includes a base stand 11, a robot arm (hereinafter, referred to as "arm 12") supported by the base stand 11, a substrate transfer hand (hereinafter, referred to as "hand 13") connected to a distal end of the arm 12, and an object detection sensor 41 provided to the hand 13.

The arm 12 according to the present embodiment includes a first link 21 extending in the horizontal direction and a second link 22 connected to the first link 21 via a translational joint. A translating device 63 is provided to the first link 21. By operation of the translating device 63, the second link 22 performs translation movement in parallel to the longitudinal direction of the first link 21 relative to the first link 21. The translating device 63 includes a linear motion mechanism (not shown) such as a rail and a slider, a rack and a pinion, a ball screw, or a cylinder, and a servomotor M3

(see FIG. 3) as a driving portion, for example. It is noted that the structure of the translating device 63 is not limited to the above.

A proximal end of the arm 12 is supported by the base stand 11 so as to be able to be lifted/lowered and turned. By operation of a lifting/lowering device 61, a lifting/lowering shaft 23 connected to the proximal end of the arm 12 extends/retracts so that the arm 12 moves to be lifted/lowered relative to the base stand 11. The lifting/lowering device 61 includes a linear motion mechanism (not shown) for extending/retracting the lifting/lowering shaft 23 from/into the base stand 11, and a servomotor M1 (see FIG. 3) as a driving portion, for example.

By operation of the turning device 62, the arm 12 turns about the turning axis relative to the base stand 11. The turning axis of the arm 12 substantially coincides with the axis of the lifting/lowering shaft 23. The turning device 62 includes a gear mechanism (not shown) for rotating the first link 21 about the turning axis, and a servomotor M2 (see FIG. 3) as a driving portion, for example. It is noted that the structures of the lifting/lowering device 61 and the turning device 62 are not limited to the above.

The hand 13 includes a base portion 31 connected to the distal end of the arm 12, and a blade 32 fixed to the base portion 31. The blade 32 is a thin plate member having an end forked so as to form a Y shape (or U shape).

The principal surface of the blade 32 is horizontal, and a plurality of support pads 33 for supporting the substrate W are provided on the upper surface of the blade 32. The plurality of support pads 33 are arranged so as to come into contact with the peripheral portion of the substrate W placed on the blade 32. A pusher 34 is provided on the base end side of the blade 32 on the hand 13. The substrate W placed on the blade 32 is grasped between the pusher 34 and the support pads 33 located at a distal end of the blade 32.

The hand 13 according to the present embodiment transfers the substrate W while holding the substrate W in a horizontal attitude. However, the hand 13 may be capable of holding the substrate W in a vertical attitude. The method for holding the substrate W by the hand 13 according to the present embodiment is an edge holding method. However, instead of the edge holding method, a known method for holding the substrate W, such as a sucking method, a dropping method, or a placement method may be adopted.

At least one object detection sensor 41 is provided on the hand 13. The object detection sensor 41 according to the present embodiment is a transmission-type photo-sensor. However, the object detection sensor 41 is not limited thereto, but may be an object detection sensor of contact type or non-contact type, having a linear-shaped or band-shaped detection area.

Figure 8:
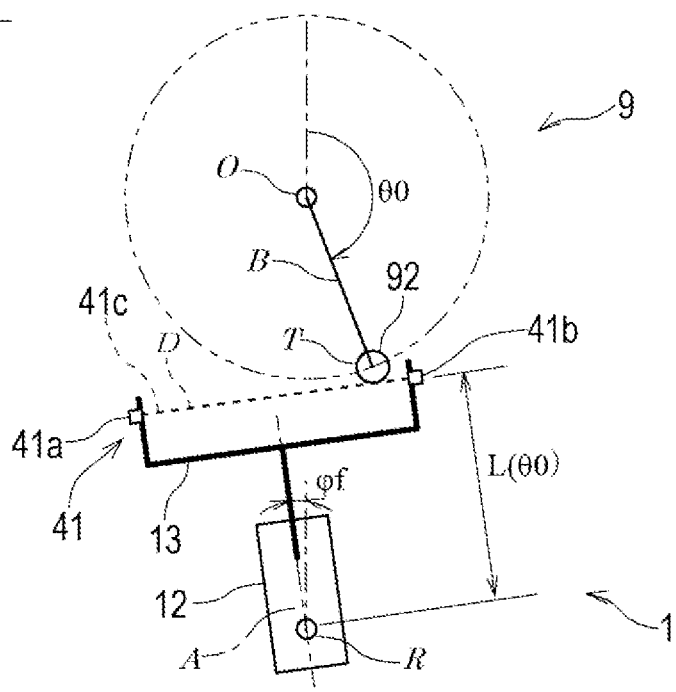
FIG. 8 is a schematic view of the substrate placement portion and the substrate transfer robot for explaining the parallelizing processing.

The object detection sensor 41 is provided on the back surfaces of the forked ends of the blade 32. With reference to FIG. 8, the object detection sensor 41 is composed of a light projector 41a provided at one of the forked ends of the blade 32, and a light receiver 41b provided at the other one. The light projector 41a and the light receiver 41b are separated from each other in a direction (i.e., horizontal direction) parallel to the principal surface of the blade 32.

The light projector 41a includes a light source for projecting light as a detection medium. The light receiver 41b includes a light receiving element which receives light projected from the light projector 41a and converts the light to an electric signal. The light projector 41a and the light receiver 41b are arranged so as to be opposed to each other, and light emitted from the light projector 41a advances linearly and enters an entrance window of the light receiver 41b. In FIG. 8, an optical axis 41c of light emitted from the light projector 41a is indicated by a dashed line. The object detection sensor 41 is a transmission-type photo-sensor and is capable of detecting an object obstructing the optical axis 41c. When an object passes on the optical axis 41c and the object detection sensor 41 detects that the amount of light entering the light receiver 41b has reduced, the object detection sensor 41 outputs an object detection signal to the controller 15.

[Structure of Controller 15]

Figure 3:
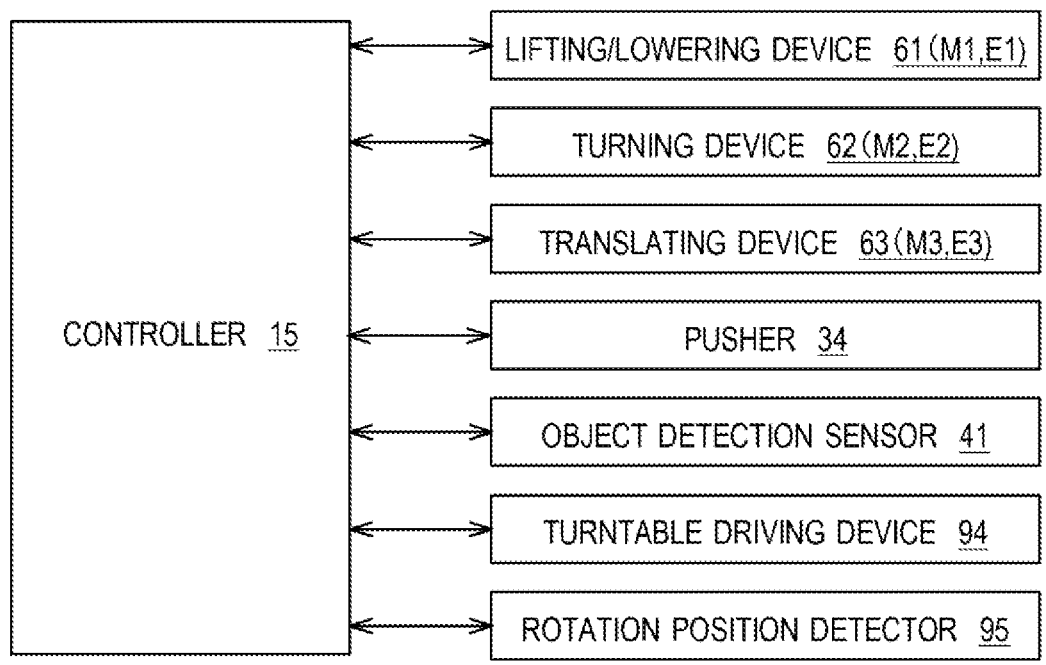
FIG. 3 is a diagram showing the configuration of a control system of the substrate transfer apparatus.

FIG. 3 is a diagram showing the configuration of a control system of the substrate transfer apparatus 10. As shown in FIG. 3, operations of the substrate transfer robot 1 and the substrate placement portion 9 are controlled by the controller 15. However, independent control means may be respectively provided to the substrate transfer robot 1 and the substrate placement portion 9, and these control means may control operation of the substrate transfer apparatus 10 while communicating with each other.

The controller 15 is a so-called computer, and, for example, includes a computing processing device (processor) such as a microcontroller, a CPU, an MPU, a PLC, a DSP, an ASIC, or an FPGA, and volatile and nonvolatile storage devices such as a ROM and a RAM (these are not shown). The storage devices store programs to be executed by the computing processing device, various fixed data, and the like. The programs stored in the storage devices include a rotation axis search program according to the present embodiment. In addition, the storage devices store teaching data for controlling operation of the arm 12, data relevant to the shapes and dimensions of the arm 12 and the hand 13, data relevant to the shape and dimensions of the substrate W held by the hand 13, data for controlling operation of the turntable driving device 94, and the like.

In the controller 15, the computing processing device reads and executes software such as a program stored in the storage device, thereby performing processing for controlling operations of the substrate transfer robot 1 and the substrate placement portion 9. It is noted that the controller 15 may execute each processing through centralized control by a single computer, or may execute each processing through decentralized control by coordination of a plurality of computers.

The servomotor M1 of the lifting/lowering device 61 of the arm 12, the servomotor M2 of the turning device 62, and the servomotor M3 of the translating device 63 are connected to the controller 15. The servomotors M1 to M3 are respectively provided with position detectors E1 to E3 for detecting the rotation angles of the output shafts thereof, and detection signals from the position detectors E1 to E3 are outputted to the controller 15. Further, the pusher 34 of the hand 13 is also connected to the controller 15. On the basis of rotation positions detected by the position detectors E1 to E3, the pose (i.e., position and attitude in space) of the hand 13 corresponding thereto, and teaching data stored in a storage unit, the controller 15 calculates a desired pose to be made after elapse of a predetermined control time. The controller 15 operates the servomotors M1 to M3 so that the hand 13 has a desired pose after elapse of the predetermined control time.

Further, the turntable driving device 94 and the rotation position detector 95 of the turntable 90 are connected to the controller 15. The controller 15 operates the turntable driving device 94 on the basis of a program stored in advance and a rotation position detected by the rotation position detector 95. Thus, the substrate placement portion 9 can be rotated to a desired rotation position.

[Method for Searching For Rotation Axis O of Substrate Placement Portion 9]

Here, a method for searching for the rotation axis O of the substrate placement portion 9 by the substrate transfer robot 1 will be described. Hereinafter, although not specifically described, the controller 15 reads and executes a predetermined program stored in advance, to perform each processing for searching for the rotation axis O of the substrate placement portion 9.

The substrate transfer robot 1 is provided with a "robot reference axis R". The robot reference axis R is a virtual axis extending in parallel to the rotation axis O of the substrate placement portion 9. In the present embodiment, the robot reference axis R is set coaxially with the turning axis of the arm 12, and on the basis of the robot reference axis R, a robot coordinate system to be used for control of the substrate transfer robot 1 is established. The robot reference axis R may be set at any position in the substrate transfer robot 1. Hereinafter, a method for searching for the position of the rotation axis O of the substrate placement portion 9 relative to the robot reference axis R, i.e., the direction toward the rotation axis O as seen from the robot reference axis R, will be described.

Figure 4:
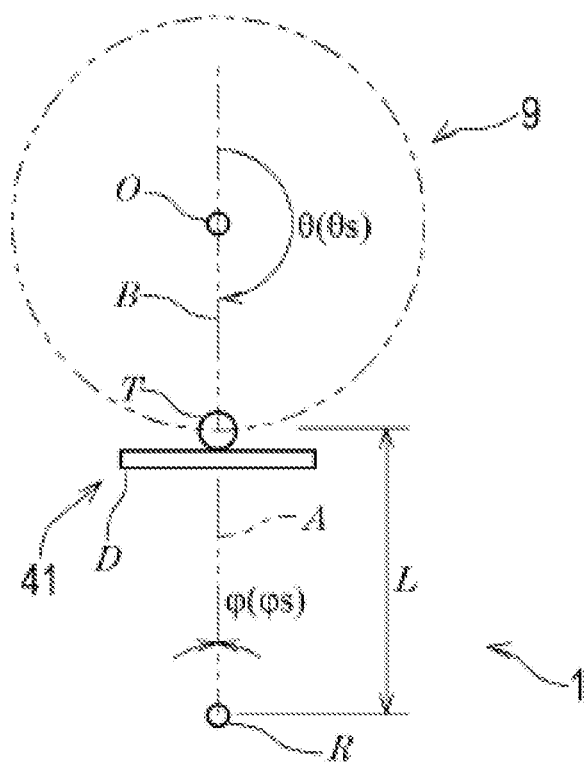
FIG. 4 is a schematic view of a substrate placement portion and a substrate transfer robot for explaining a rotation axis searching method.

As shown in FIG. 4, the object detection sensor 41 has a detection line D which is a band-shaped or linear-shaped detection area. In the present embodiment, the optical axis 41c corresponds to the detection line D. The object detection sensor 41 is supported by the arm 12, and can change the pose (i.e., position and attitude in space) of the detection line D through a turning operation and/or an extending/retracting operation of the arm 12. In other words, the detection line D rotates about the robot reference axis R through a turning operation of the arm 12, and the detection line D moves close to/away from the robot reference axis R through an extending/retracting operation of the arm 12. The controller 15 can obtain the pose of the detection line D, i.e., the position and the attitude thereof relative to the robot reference axis R, through calculation from the rotation positions of the motors M1 to M3 detected by the position detectors E1 to E3 of the substrate transfer robot 1, and the like. In particular, the controller 15 can calculate a rotation position $\varphi$ which is the rotation angle of the detection line D from a predetermined reference rotation position, on the basis of the rotation position of the motor M2 for turning, detected by the position detector E2 of the turning device 62.

The substrate placement portion 9 rotates about the rotation axis O, and thereby can change a rotation position $\theta$ which is the rotation angle of the substrate placement portion 9 from the predetermined reference rotation position. The controller 15 can calculate the rotation position $\theta$ of the substrate placement portion 9, from a detection value of the rotation position detector 95 provided to the substrate placement portion 9.

The controller 15 performs processing of searching for a target T in the substrate transfer robot 1 at a plurality of rotation positions $\theta$ of the substrate placement portion 9, to calculate an index length L for each rotation position $\theta$. The index length L is the distance from the robot reference axis R to the target T (or detection line D). In the present embodiment, one of the plurality of support columns 92 provided to the substrate placement portion 9 is used as the target T. The target T has a columnar shape with a circular cross section, and the radius of the circle and the distance from the center of the circle to the rotation axis O are known. However, the target T is not limited to that shown in the present embodiment.

The fact that the substrate transfer robot 1 has found out the target T is detected on the basis of switching from ON to OFF of light reception in the light receiver 41b when the target T obstructs the optical axis 41c of the object detection sensor 41. Alternatively, the fact that the substrate transfer robot 1 has found out the target T is detected on the basis of switching from OFF to ON of light reception in the light receiver 41b when the target T no longer obstructs the optical axis 41c of the object detection sensor 41.

On the basis of the plurality of index lengths L obtained at the plurality of rotation positions $\theta$ of the substrate placement portion 9 as described above, the controller 15 calculates a rotation position $\theta$s of the substrate placement portion 9 and/or a rotation position $\varphi$s of the detection line D when the target T is located on a line connecting the robot reference axis R and the rotation axis O. The index length L when the target T located on the line connecting the robot reference axis R and the rotation axis O is detected is maximum. Using the index length L simplifies the calculation, but the rotation position $\theta$s of the substrate placement portion 9 and/or the rotation position $\varphi$s of the detection line D when the target T is located on the line connecting the robot reference axis R and the rotation axis O can be calculated even by using information correlated with the index length L, instead of using the index length L. The information correlated with the index length L is, for example, the pose of a given reference point set on the hand 13, or the rotation positions of the motors M2, M3 which displace the detection line D.

On the basis of at least one of the rotation position $\theta$s of the substrate placement portion 9 and the rotation position $\varphi$s of the detection line D, the controller 15 calculates the extending direction of the line connecting the robot reference axis R and the rotation axis O, in other words, the direction toward the rotation axis O as seen from the robot reference axis R. It is noted that, from the rotation position $\theta$s of the substrate placement portion 9, the rotation position $\varphi$s of the detection line D can be calculated through searching for the target T by the substrate transfer robot 1 with the substrate placement portion 9 set at the rotation position $\theta$s. From the rotation position $\varphi$s of the detection line D, the direction toward the rotation axis O as seen from the robot reference axis R can be directly calculated.

The controller 15 may teach (store) the above calculated direction toward the rotation axis O as seen from the robot reference axis R, into the storage device, as a turning angle of 0° of the detection line D (arm 12). Here, in teaching of the turning angle, the controller 15 stores the detection value of the position detector E2 of the turning device 62 into the storage device.

In addition, the controller 15 can also calculate the distance from the robot reference axis R to the rotation axis O on the basis of the rotation position $\theta$s of the substrate placement portion 9. The distance from the robot reference axis R to the rotation axis O is the sum of the maximum value of the index length L and a known distance from the rotation axis O to the target T.

The controller 15 may store (teach) the above calculated distance from the robot reference axis R to the rotation axis O, into the storage device.

Hereinafter, a searching process for the rotation axis O of the substrate placement portion 9 will be described using a specific example. In the following description, a line perpendicular to the axial direction of the robot reference axis R and connecting the distal end of the arm 12 at which the detection line D is provided and the robot reference axis R, is defined as "arm reference line A". The rotation angle of the arm reference line A from a given reference rotation position is represented by "rotation position φ". The rotation position φ of the arm reference line A is the same as or correlated with the rotation position of the detection line D. In the present embodiment, the extending direction of the arm reference line A and the extending direction of the detection line D are perpendicular to each other. However, the extending direction of the arm reference line A and the extending direction of the detection line D may not be perpendicular to each other as long as the relative angle therebetween is known. A line perpendicular to the axial direction of the robot reference axis R and connecting a given reference point on the target T and the rotation axis O, is defined as "placement portion reference line B". The rotation angle of the placement portion reference line B from a given reference rotation position is represented by "rotation position θ". The rotation position θ of the placement portion reference line B is the same as or correlated with the rotation position of the substrate placement portion 9.

Figure 5:
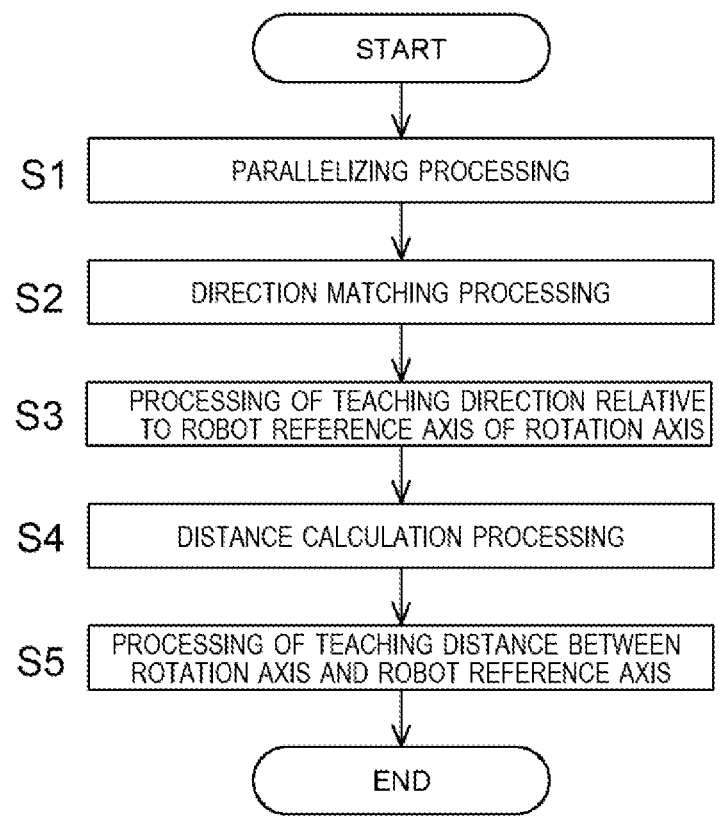
FIG. 5 is a flowchart showing flow of a rotation axis searching process.

FIG. 5 is a flowchart showing flow of the searching process for the rotation axis O of the substrate placement portion 9. As shown in FIG. 5, in the searching process for the rotation axis O of the substrate placement portion 9, parallelizing processing (step S1) of making the placement portion reference line B and the arm reference line A parallel to each other, direction matching processing (step S2) of causing the extending direction of the placement portion reference line B and the extending direction of the arm reference line A to coincide with each other, and teaching processing (step S3) for the direction of the rotation axis O relative to the robot reference axis R, are performed in this order.

Further, in the searching process for the rotation axis O of the substrate placement portion 9, distance calculation processing (step S4) for calculating the distance from the robot reference axis R to the rotation axis O and teaching processing (step S5) for the distance from the robot reference axis R to the rotation axis O are performed subsequently to the above step S3. Hereinafter, the parallelizing processing, the direction matching processing, and the distance calculation processing will be described in detail.

[Parallelizing Processing]

The parallelizing processing (step S1) includes a step of calculating a first rotation position θf of the substrate placement portion 9 and a first rotation position φf of the detection line D at which the placement portion reference line B and the arm reference line A are parallel to each other, and a step of moving the substrate placement portion 9 to the first rotation position θf and moving the detection line D to the first rotation position φf. These two steps may be performed simultaneously.

(First Method of Parallelizing Processing)

Figure 6:
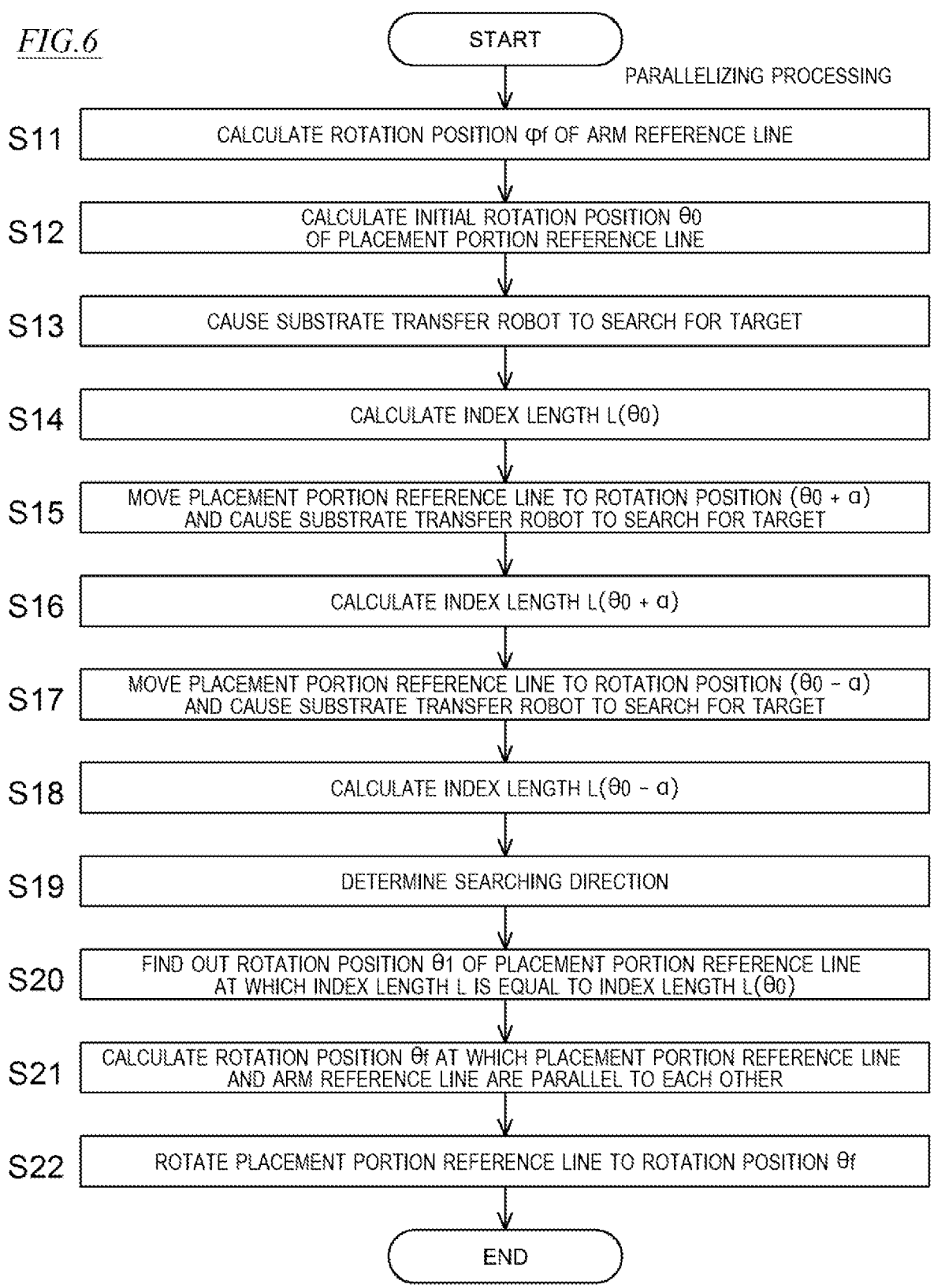
FIG. 6 is a flowchart showing flow of parallelizing processing in a first method.

FIG. 6 is a flowchart showing flow of the parallelizing processing in the first method, and FIGS. 8 to 12 are schematic views of the substrate placement portion 9 and the substrate transfer robot 1 for explaining the parallelizing processing. In the parallelizing processing in the first method, while the rotation position φ of the arm reference line A (i.e., rotation position φ of detection line D) is kept at the first rotation position φf, two rotation positions θ0, θ1 of the placement portion reference line B (i.e., rotation positions θ0, θ1 of substrate placement portion 9) at which the index lengths L are equal are searched for, and the center rotation position between the two rotation positions θ0, θ1 is calculated as the first rotation position θf.

When starting the parallelizing processing in the first method, the controller 15 designates one of the plurality of support columns 92 provided to the substrate placement portion 9, as the target T. As the target T, for example, one of the plurality of support columns 92 that is closest to the robot reference axis R may be selected. Alternatively, the target T may be designated from the plurality of support columns 92 in accordance with an input received from an operator. The target T is not limited to the support column 92. A target T other than the support column 92 may be provided to the substrate placement portion 9.

As shown in FIG. 6 and FIG. 8, first, the controller 15 calculates the rotation position φ of the arm reference line A (step S11) and stores the rotation position φ as the first rotation position φf. In addition, the controller 15 calculates the rotation position θ of the placement portion reference line B (step S12) and stores the rotation position θ as an initial rotation position θ0.

Next, the controller 15 causes the substrate transfer robot 1 to search for the target T when the placement portion reference line B is at the initial rotation position θ0 (step S13). Then, the controller 15 calculates the index length $L(θ0)$ when the target T is detected (step S14).

Figure 9A:
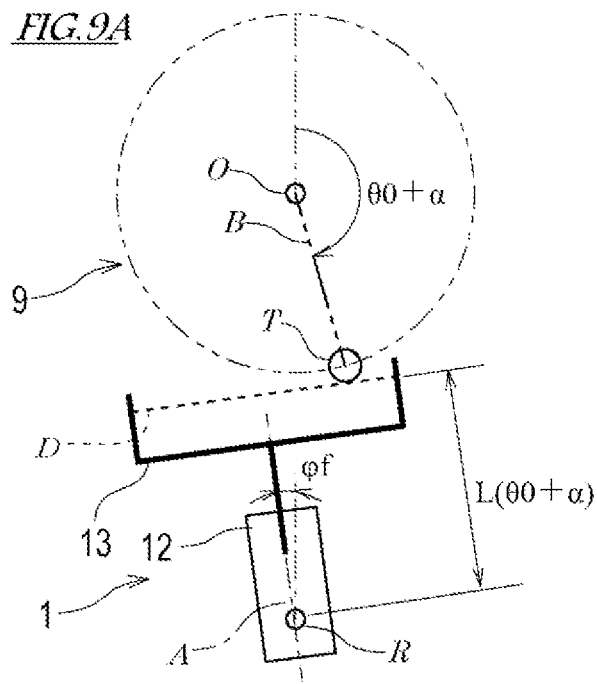
FIG. 9 is a schematic view of the substrate placement portion and the substrate transfer robot for explaining the parallelizing processing.

Subsequently, as shown in FIG. 9A, the controller 15 forwardly rotates the placement portion reference line B from the initial rotation position θ0 by a given angle α, to cause the substrate transfer robot 1 to search for the target T (step S15). Then, the controller 15 calculates an index length $L(θ0+α)$ when the target T is detected (step S16).

Figure 9B:
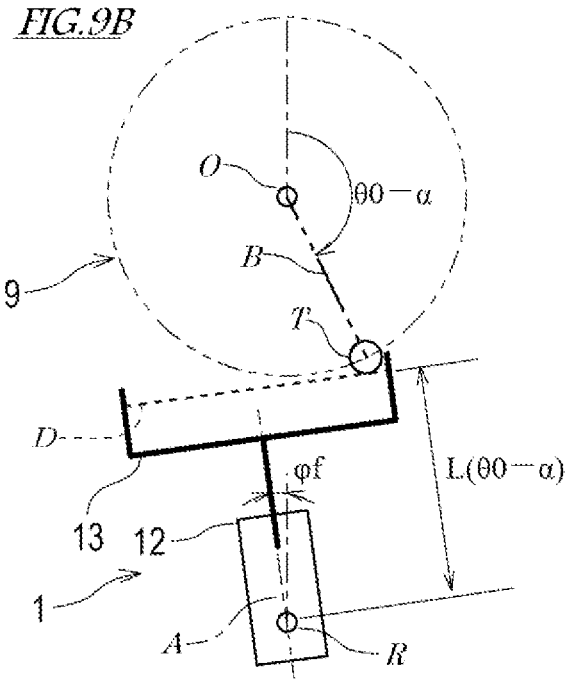

Subsequently, as shown in FIG. 9B, the controller 15 reversely rotates the placement portion reference line B from the initial rotation position θ0 by α, to cause the substrate transfer robot 1 to search for the target T (step S17). Then, the controller 15 calculates an index length $L(θ0−α)$ when the target T is detected (step S18). It is noted that, in the above steps S13, S15, S17, the controller 15 causes the arm 12 to extend/retract so as to move the detection line D to the position at which the target T is detected, while keeping the arm reference line A at the first rotation position φf.

Further, the controller 15 compares the index length $L(θ0+α)$ and the index length $L(θ0−α)$, and determines, as "searching direction", the rotation direction from the initial rotation position θ0 to the rotation position at which the smaller one of the index length $L(θ0+α)$ and the index length $L(θ0−α)$ is obtained (step S19). In the example shown in FIG. 9A and FIG. 9B, the index length $L(θ0+α)$ is smaller than the index length $L(θ0−α)$, and therefore, the searching direction is determined to be "forward rotation direction".

Figure 10:
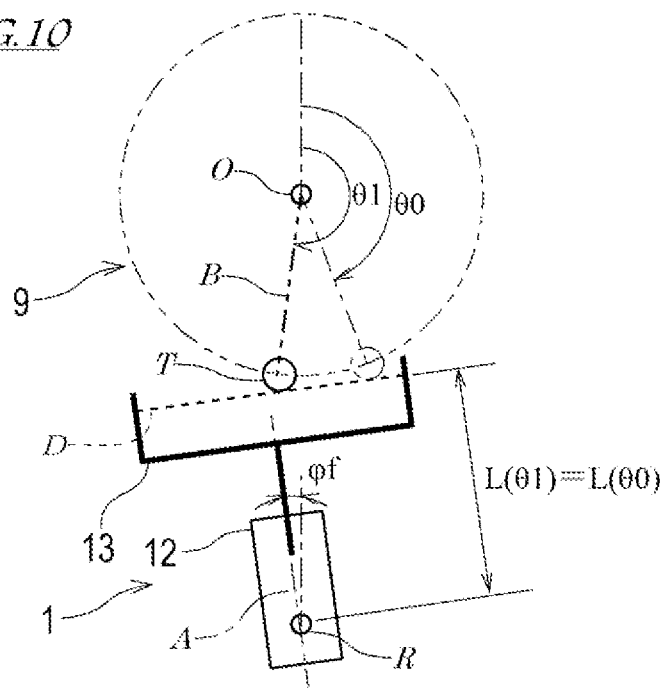
FIG. 10 is a schematic view of the substrate placement portion and the substrate transfer robot for explaining the parallelizing processing.

Subsequently, as shown in FIG. 10, the controller 15 repeats an operation of, with the arm reference line A kept at the first rotation position φf, rotating the substrate placement portion 9 in the searching direction and searching for the target T by the substrate transfer robot 1, thereby finding out the rotation position θ1 at which an index length $L(θ1)$ is equal to the initial index length $L(θ0)$ (step S20).

Figure 11:
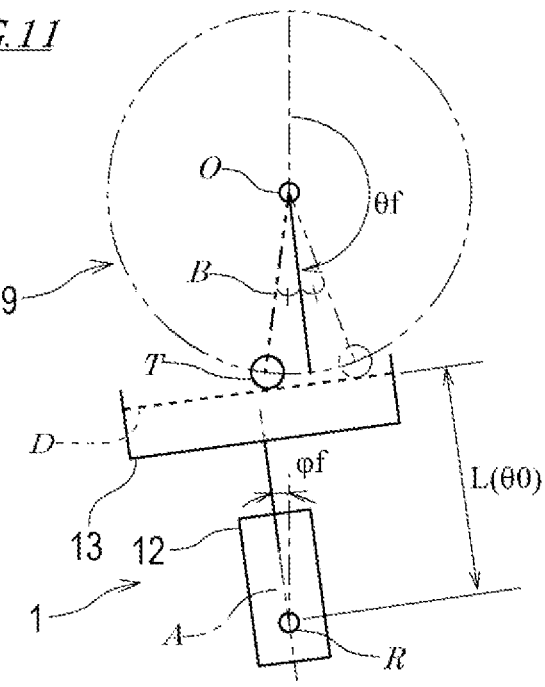
FIG. 11 is a schematic view of the substrate placement portion and the substrate transfer robot for explaining the parallelizing processing.

Then, as shown in FIG. 11, the controller 15 calculates the middle rotation position $(θf=(θ0+θ1)/2)$ between the initial rotation position θ0 and the rotation position θ1 of the placement portion reference line B, as the first rotation position θf at which the placement portion reference line B and the arm reference line A are parallel to each other (step S21).

Finally, the controller 15 rotates the placement portion reference line B to the first rotation position θf (step S22). Through the above parallelizing processing, the placement portion reference line B and the arm reference line A become parallel to each other.

(Second Method of Parallelizing Processing)

The parallelizing processing may be performed by the following second method, instead of the above first method. In the parallelizing processing in the second method, as in the parallelizing processing in the first method, while the rotation position φ of the arm reference line A is kept at the first rotation position φf, two rotation positions θ0, θ1 of the placement portion reference line B at which the index lengths L are equal are searched for, and the center rotation position between the two rotation positions θ0, θ1 is calculated as the first rotation position θf of the placement portion reference line B. However, in the first method, the placement portion reference line B is rotated little by little to calculate the index length L, whereas, in the second method, the change point between detection and non-detection of the target T by the object detection sensor 41 is specified, whereby the two rotation positions θ0, θ1 are searched for without calculation of the index length L.

In the parallelizing processing in the second method, the processing flow from step S11 to step S14 and from step S21 to step S22 in the above first method is the same, and description of these steps is omitted.

In the second method, after step S14, the controller 15 rotates the placement portion reference line B in one of the forward direction and the reverse direction from the initial rotation position θ0 until the target T is no longer detected by the object detection sensor 41. Subsequently, the controller 15 rotates the placement portion reference line B in the other one of the forward direction and the reverse direction until the target T is again no longer detected by the object detection sensor 41. Further, the controller 15 slightly rotates the placement portion reference line B in the one of the forward direction and the reverse direction until the target T is detected by the object detection sensor 41, and detects the rotation angle (θ1) when the target T is detected again (see FIG. 10). Finally, the controller 15 performs the above processing of steps S21 and S22, using the initial rotation position θ0 and the rotation position θ1. Through the above parallelizing processing in the second method, the placement portion reference line B and the arm reference line A become parallel to each other.

(Third Method of Parallelizing Processing)

The parallelizing processing may be performed by the following third method, instead of the above first method. In the parallelizing processing in the third method, while the rotation position φ of the arm reference line A is kept at the first rotation position φf, the rotation position θ of the placement portion reference line B at which the index length L is minimized is searched for, and this rotation position θ is calculated as the first rotation position θf.

In the parallelizing processing in the third method, the processing flow from step S11 to step S1 in the above first method is the same, and the description of these steps is omitted.

In the third method, after step S19, the controller 15 repeats an operation of, with the detection line D kept at the first rotation position φf, rotating the placement portion reference line B in the searching direction and searching for the target T by the substrate transfer robot 1, thereby finding out the first rotation position θf at which the index length L(θf) is minimized. Finally, the controller 15 performs the above processing of step S22. Through the above parallelizing processing in the third method, the placement portion reference line B and the arm reference line A become parallel to each other.

In the parallelizing processing in the first to third methods described above, the rotation position θ of the placement portion reference line B is changed while the arm reference line A is kept at the first rotation position φf. However, the processing for making the placement portion reference line B and the arm reference line A parallel to each other may be performed by changing the rotation position γ of the arm reference line A while keeping the rotation position θ of the placement portion reference line B at the first rotation position θf, or by changing the rotation position θ of the placement portion reference line B and the rotation position φ of the arm reference line A.

[Direction Matching Processing]

In the state when the parallelizing processing (step S1) is finished, the placement portion reference line B and the arm reference line A are parallel to each other, and therefore, the alternate angles formed between a line connecting the rotation axis O, the robot reference axis R and the rotation axis O, and the placement portion reference line B and the arm reference line A, are equal to each other. The direction matching processing (step S2) includes a step of calculating the rotation position (second rotation position θs) of the placement portion reference line B at which the extending direction of the placement portion reference line B and the extending direction of the arm reference line A coincide with each other, and a step of moving the placement portion reference line B to the second rotation position θs and moving the arm reference line A to the second rotation position φs. These two steps may be performed simultaneously.

(First Method of Direction Matching Processing)

Figure 7:
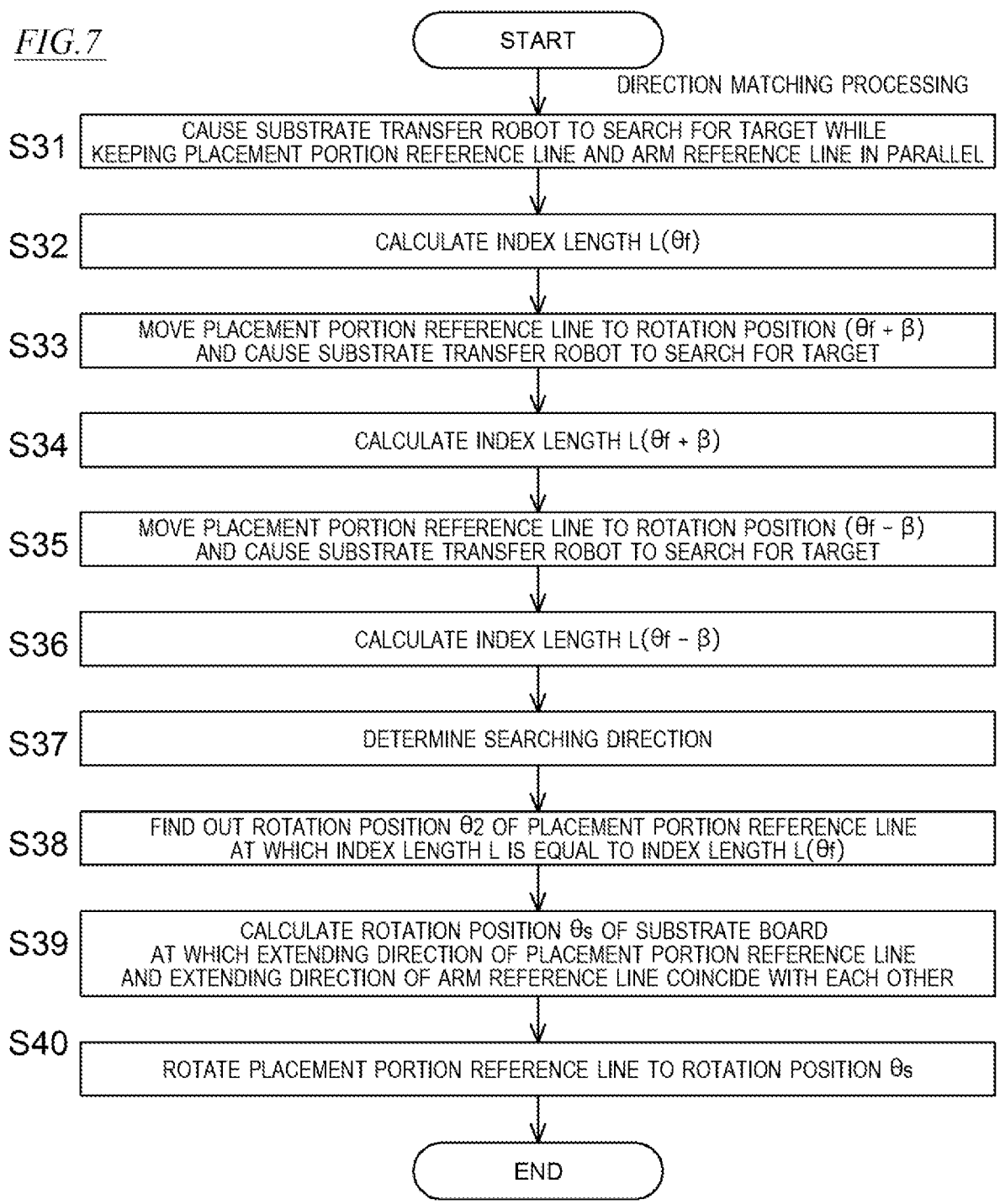
FIG. 7 is a flowchart showing flow of direction matching processing in the first method.
Figure 12:
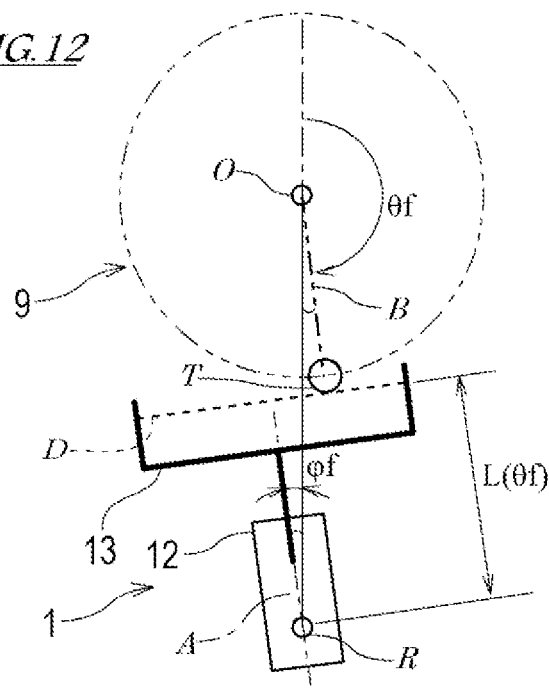
FIG. 12 is a schematic view of the substrate placement portion and the substrate transfer robot for explaining the parallelizing processing.
Figure 13:
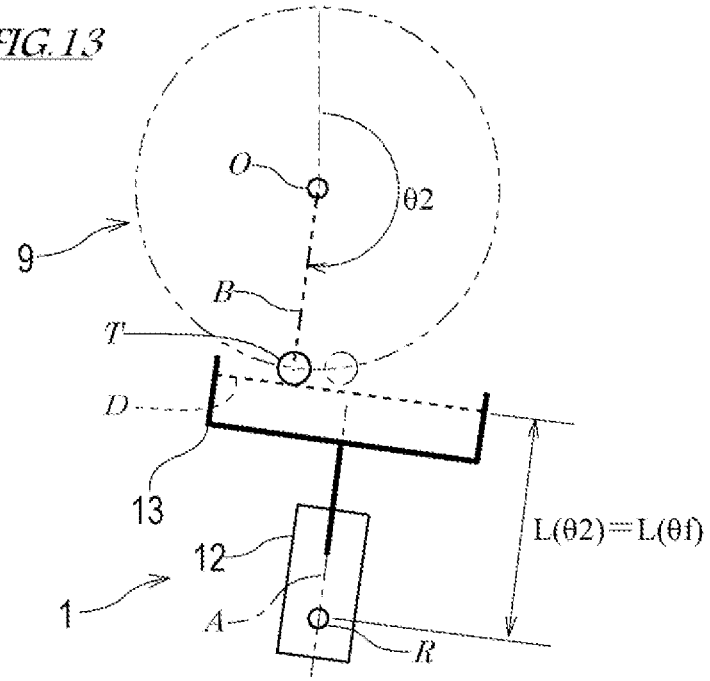
FIG. 13 is a schematic view of the substrate placement portion and the substrate transfer robot for explaining the direction matching processing.
Figure 14:
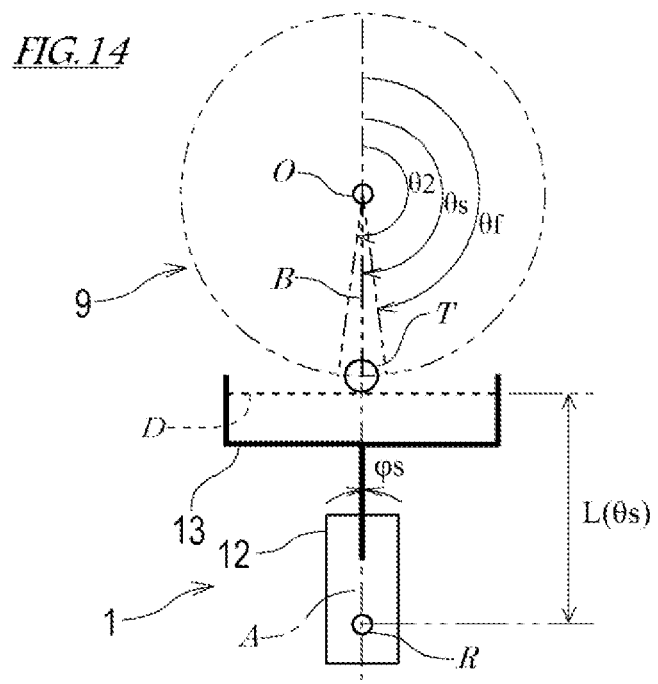
FIG. 14 is a schematic view of the substrate placement portion and the substrate transfer robot for explaining the direction matching processing.

FIG. 7 is a flowchart showing flow of the direction matching processing in the first method, and FIG. 13 and FIG. 14 are schematic views of the placement portion reference line B and the substrate transfer robot 1 for explaining the direction matching processing. As shown in FIG. 7 and FIG. 12, in the direction matching processing in the first method, while keeping a state in which the placement portion reference line B is at the first rotation position θf and the arm reference line A is at the first rotation position φf, the controller 15 causes the substrate transfer robot 1 to search for the target T (step S31), and calculates the index length L(θf) when the target T is detected (step S32).

Next, the controller 15 forwardly rotates the placement portion reference line B from the first rotation position θf by a given angle β, and similarly, forwardly rotates the arm reference line A from the first rotation position φf by the angle β. Then, the controller 15 causes the substrate transfer robot 1 to search for the target T when the placement portion reference line B is at the rotation position (θf+β) (step S33), and calculates the index length L(θf+β) when the target T is detected (step S34).

Subsequently, the controller 15 reversely rotates the placement portion reference line B from the first rotation position θf by the given angle β, and similarly, reversely rotates the arm reference line A from the first rotation position φf by the angle β. Then, the controller 15 causes the substrate transfer robot 1 to search for the target T when the placement portion reference line B is at the rotation position (θf−β) (step S35), and calculates the index length L(θf−β) when the target T is detected (step S36).

Further, the controller 15 compares the index length L(θf+β) and the index length L(θf−β), and determines, as "searching direction", the rotation direction in which the greater one of the index length L(θf+β) and the index length L(θf−β) is obtained (step S37). In the example shown in FIG. 12, the index length L(θf+β) is greater than the index length L(θf−β), and therefore the searching direction is determined to be the forward rotation direction.

Subsequently, as shown in FIG. 13, the controller 15 repeats an operation of rotating the placement portion reference line B and the arm reference line A in the searching direction by the same rotation angle and searching for the target T by the substrate transfer robot 1, thereby finding out the rotation position θ2 of the placement portion reference line B at which the index length L(θ2) is equal to the index length L(θf) (step S38).

Then, as shown in FIG. 14, the controller 15 calculates the middle rotation position (θs=(θf +θ2)/2) between the first rotation position θf and the rotation position θ2, as the second rotation position θs of the placement portion reference line B at which the extending direction of the placement portion reference line B and the extending direction of the arm reference line A coincide with each other (step S39).

The controller 15 rotates the placement portion reference line B from the rotation position θ2 to the second rotation position θs, and rotates the arm reference line A in the same rotation direction and by the same rotation angle as the placement portion reference line B (step S40). Through the above direction matching processing, the extending direction of the placement portion reference line B and the extending direction of the arm reference line A coincide with each other.

(Second Method of Direction Matching Processing)

The direction matching processing may be performed by the following second method, instead of the above first method. In the parallelizing processing in the second method, as in the method matching processing in the first method, the placement portion reference line B and the arm reference line A are rotated about the rotation axis O and the robot reference axis R, respectively, in the same rotation direction by the same rotation angle, to search for two rotation positions θf, θ2 at which the index lengths L are equal, and the center rotation position between the two rotation positions θf, θ2 is calculated as the second rotation position θs. However, in the first method, the placement portion reference line B is rotated little by little to calculate the index length L, whereas, in the second method, the change point between detection and non-detection of the target T by the object detection sensor 41 is specified, whereby the two rotation positions θf, θ2 are searched for without calculation of the index length L.

In the direction matching processing in the second method, the processing flow from step S31 to step S32 in the above first method is the same, and description of these steps is omitted.

In the second method, after step S32, the controller 15 rotates the placement portion reference line B and the arm reference line A in the same rotation direction by the same rotation angle until the target T is no longer detected by the object detection sensor 41. Here, the rotation direction is one of the forward direction and the reverse direction. Subsequently, the controller 15 rotates the placement portion reference line B and the arm reference line A by the same rotation angle in the other one of the forward direction and the reverse direction until the target T is detected again by the object detection sensor 41. Further, the controller 15 detects the rotation angle (θ2) of the placement portion reference line B when the target T is detected again (see FIG. 13). Finally, the controller 15 performs the above processing of steps S39 and S40, using the first rotation position θf and the rotation position θ2. Through the above direction matching processing in the second method, the extending direction of the placement portion reference line B and the extending direction of the arm reference line A coincide with each other.

(Third Method of Direction Matching Processing)

The direction matching processing may be performed by the following third method, instead of the above first method. In the direction matching processing in the third method, the placement portion reference line B and the arm reference line A are rotated in the same rotation direction by the same rotation angle, to search for the rotation position of the placement portion reference line B at which the index length L is maximized, and this rotation position is calculated as the second rotation position θs.

In the direction matching processing in the third method, the processing flow from step S31 to step S37 in the above first method is the same, and description of these steps is omitted.

In the second method, after step S37, the controller 15 rotates the placement portion reference line B and the arm reference line A in the searching direction by the same rotation angle, and detects the target T by the object detection sensor 41, thereby searching for the rotation position θs of the placement portion reference line B at which the index length L is maximized. At the searched rotation position θs, the extending direction of the placement portion reference line B and the extending direction of the arm reference line A coincide with each other.

[Distance Calculation Processing]

In the distance calculation processing (step S4), the controller 15 causes the substrate transfer robot 1 to search for the target T when the placement portion reference line B is at the second rotation position θs, and calculates the index length L(θs) when the target T is detected. Further, the controller 15 calculates the distance between the rotation axis O and the robot reference axis R on the basis of the above index length L(θs), a known distance from the rotation axis O to the target T, and a known shape of the target T, and stores the calculated distance as teaching data into the storage device.

The index length L(θs) is the same as the maximum value of the index length L calculated in the third method of the direction matching processing. Therefore, in the case of adopting the third method for the direction matching processing, the above searching processing in the distance calculation processing can be omitted.

As described above, the substrate transfer apparatus 10 according to the present embodiment includes: the substrate transfer robot 1 provided with the robot reference axis R, the substrate transfer robot 1 having the object detection sensor 41 for detecting an object obstructing the detection line D and the arm 12 for moving the object detection sensor 41 in a plane perpendicular to the axial direction of the robot reference axis R; the substrate placement portion 9 having the target T to be detected by the object detection sensor 41, the substrate placement portion 9 being configured to rotate about the rotation axis O extending in parallel to the axial direction; and the controller configured to control operations of the substrate transfer robot 1 and the substrate placement portion 9.

In the substrate transfer apparatus 10 according to the present embodiment, the controller 15 detects the target T by the object detection sensor 41 at the plurality of rotation positions θ of the substrate placement portion 9, and calculates the index length L which is the distance from the robot reference axis R to the target T in a direction perpendicular to the axial direction, or information correlated therewith. On the basis of the calculated index length L or the calculated information correlated therewith, the controller 15 calculates at least one of the rotation position cps of the detection line D about the robot reference axis R and the rotation position θs of the substrate placement portion 9 about the rotation axis O when the target T located on the line connecting the robot reference axis R and the rotation axis O is detected. The controller 15 specifies the direction in which the rotation axis O is present as seen from the robot reference axis R, on the basis of the calculated rotation position.

Similarly, the method for searching for the rotation axis O of the substrate placement portion 9 according to the present embodiment includes: detecting the target T provided to the substrate placement portion 9 by the object detection sensor 41 at a plurality of rotation positions O of the substrate placement portion 9; calculating the index length L which is the distance from the robot reference axis R to the target T in a direction perpendicular to the axial direction, or information correlated therewith; on the basis of the calculated index length L or the calculated information correlated therewith, calculating at least one of the rotation position cps of the detection line D about the robot reference axis R and the rotation position θs of the substrate placement portion 9 about the rotation axis O when the target T located on the line connecting the robot reference axis R and the rotation axis O is detected; and specifying the direction in which the rotation axis O is present as seen from the robot reference axis R on the basis of the calculated rotation position.

With the substrate transfer apparatus 10 and the method for searching for the rotation axis O of the substrate placement portion 9 described above, it is possible to specify the direction in which the rotation axis O is present as seen from the robot reference axis R, on the basis of the rotation position φs of the detection line D about the robot reference axis R when the target T located on the line connecting the robot reference axis R and the rotation axis O is detected. It is noted that, if the rotation position Os of the rotation axis O when the target T located on the line connecting the robot reference axis R and the rotation axis O is detected is found, the rotation position of the detection line D about the robot reference axis R can be calculated through searching by using the rotation position θs. Then, by the substrate transfer robot 1 automatically performing the above operation, it becomes possible to automatically teach the substrate transfer robot 1 the direction toward the rotation axis O relative to the robot reference axis R.

In the substrate transfer apparatus 10 according to the above embodiment, the controller 15 calculates the distance from the robot reference axis R to the rotation axis O on the basis of the index length L when the target T located on the line connecting the robot reference axis R and the rotation axis O is detected, and a known distance from the rotation axis O to the target T.

Similarly, in the method for searching for the rotation axis O of the substrate placement portion 9 according to the above embodiment, the distance from the robot reference axis to the rotation axis is calculated on the basis of the index length when the target located on the line connecting the robot reference axis and the rotation axis is detected, and a known distance from the rotation axis to the target.

With the substrate transfer apparatus 10 and the method for searching for the rotation axis O of the substrate placement portion 9, it becomes possible to automatically teach the substrate transfer robot 1 the distance from the robot reference axis R to the rotation axis O.

In the substrate transfer apparatus 10 according to the above embodiment, the controller 15 calculates the first placement portion rotation position θf of the placement portion reference line B about the rotation axis O and the first arm rotation position φf of the arm reference line A about the robot reference axis R at which the placement portion reference line B and the arm reference line A are parallel to each other, and the controller 15 calculates the second placement portion rotation position θs of the placement portion reference line B and the second arm rotation position φs of the arm reference line A at which the extending direction of the placement portion reference line B and the extending direction of the arm reference line A coincide with each other, by rotating the placement portion reference line B located at the first placement portion rotation position θf and the arm reference line A located at the first arm rotation position φf in the same direction by the same rotation angle. Here, a line perpendicular to the axial direction of the robot reference axis R and passing the distal end of the arm 12 to which the object detection sensor 41 is connected and the robot reference axis R, is defined as the arm reference line A, and a line perpendicular to the axial direction of the robot reference axis R and passing the rotation axis O and the target T is defined as the placement portion reference line B.

Further, the controller 15 moves the placement portion reference line B to the first placement portion rotation position θf and moves the arm reference line A to the first arm rotation position φf, and the controller 15 moves the placement portion reference line B from the first placement portion rotation position θf to the second placement portion rotation position θs and moves the arm reference line A from the first arm rotation position φf to the second arm rotation position φs. The controller 15 stores the rotation positions of joints of the arm 12 (i.e., rotation positions detected by position detectors E1 to E3) when the arm reference line A is at the second arm rotation position φs.

Similarly, the method for searching for the rotation axis O of the substrate placement portion 9 according to the above embodiment includes the steps of: calculating the first placement portion rotation position θf of the placement portion reference line B about the rotation axis O and the first arm rotation position φf of the arm reference line A about the robot reference axis R at which the placement portion reference line B and the arm reference line A are parallel to each other; and calculating the second placement portion rotation position 74 s of the placement portion reference line B and the second arm rotation position φs of the arm reference line A at which the extending direction of the placement portion reference line B and the extending direction of the arm reference line A coincide with each other, by rotating the placement portion reference line B located at the first placement portion rotation position θf and the arm reference line A located at the first arm rotation position φf in the same direction by the same rotation angle.

Further, the method for searching for the rotation axis O of the substrate placement portion 9 according to the above embodiment includes the steps of: moving the placement portion reference line B to the first placement portion rotation position θf and moving the arm reference line A to the first arm rotation position φf; and moving the placement portion reference line B from the first placement portion rotation position θf to the second placement portion rotation position θs and moving the arm reference line A from the first arm rotation position φf to the second arm rotation position φs.

With the substrate transfer apparatus 10 and the method for searching for the rotation axis O of the substrate placement portion 9 described above, processing of specifying the direction in which the rotation axis O is present as seen from the robot reference axis R using the index length L calculated when the target T is detected at the plurality of rotation positions θ of the placement portion reference line B or information correlated therewith, can be realized without complicated calculation or the like.

While the preferred embodiment of the present invention has been described above, the details of specific structures and/or functions of the above embodiment may be modified without deviating from the scope of the present invention, and such modifications can be included in the present invention.

REFERENCE SIGNS LIST 1 substrate transfer robot
9 substrate placement portion
10 substrate transfer apparatus
11 base stand
12 arm
13 hand
15 controller
21, 22 link
23 lifting/lowering shaft
31 base portion
32 blade
33 support pad
34 pusher
41 object detection sensor
41a light projector
41b light receiver
41c optical axis
61 lifting/lowering device
62 turning device
63 translating device
90 turntable
91 placement portion
92 support column
94 turntable driving device
95 rotation position detector
A arm reference line
B placement portion reference line
D detection line
E1 to E3 position detector
L index length
M1 to M3 servomotor
O rotation axis
R robot reference axis
T target
W substrate

The invention claimed is:

1. A substrate placement portion rotation axis searching method for searching for a rotation axis of a substrate placement portion configured to rotate about the rotation axis, by using a substrate transfer robot provided with a robot reference axis, the substrate transfer robot having an object detection sensor for detecting a target obstructing a detection line, and a robot arm for moving the object detection sensor in a plane perpendicular to an axial direction of the robot reference axis, the rotation axis extending in parallel to the axial direction, the method comprising the steps of:
   detecting the target provided to the substrate placement portion by the object detection sensor at a plurality of rotation positions of the substrate placement portion, and calculating an index length which is a distance from the robot reference axis to the target in a direction perpendicular to the axial direction, or information correlated therewith;
   on the basis of the calculated index length or the calculated information correlated therewith, calculating at least one of a rotation position of the detection line about the robot reference axis and a rotation position of the substrate placement portion about the rotation axis when the target located on a line connecting the robot reference axis and the rotation axis is detected; and
   specifying a direction in which the rotation axis is present as seen from the robot reference axis, on the basis of the calculated rotation position, wherein
   a line perpendicular to the axial direction and passing a distal end of the robot arm to which the object detection sensor is connected and the robot reference axis is defined as an arm reference line, and a line perpendicular to the axial direction and passing the rotation axis and the target is defined as a placement portion reference tine. the method further comprising the steps of:
   calculating a first replacement portion rotation position of the placement portion reference line about the rotation axis and a first arm rotation position of the arm reference line about the robot reference axis at which: the placement portion reference line and the arm reference line are parallel to each other;
   calculating a second placement portion rotation position of the placement portion reference line and a second arm rotation position of the arm reference line at which an extending direction of the placement portion reference line and an extending direction of the arm reference line coincide with each other, by rotating the placement portion reference line located at the first placement portion rotation position and the arm reference line located at the first arm rotation position in the same direction by the same rotation angle;
   moving the placement portion reference line to the first placement portion rotation position and moving the arm reference line to the first arm rotation position; and
   moving the placement portion reference line from the first placement portion rotation position to the second placement portion rotation position and moving the arm reference line from the first arm rotation position to the second arm rotation position.

2. The substrate placement portion rotation axis searching method according to claim 1, further comprising the step of calculating a distance from the robot reference axis to the rotation axis on the basis of the index length when the target located on the line connecting the robot reference axis and the rotation axis is detected, and a known distance from the rotation axis to the target.

3. The substrate placement portion rotation axis searching method according to claim 1, wherein
   the step of calculating the first placement portion rotation position includes searching for two rotation positions of the placement portion reference line at which the index lengths are equal, while keeping the arm reference line at the first arm rotation position, and setting a center rotation position between the two rotation positions as the first placement portion rotation position.

4. The substrate placement portion rotation axis searching method according to claim 1, wherein
   the step of calculating the first placement portion rotation position includes searching for a rotation position of the placement portion reference line at which the index length is minimized, while keeping the arm reference line at the first arm rotation position, and setting the rotation position as the first placement portion rotation position.

5. The substrate placement portion rotation axis searching method according to claim 1, wherein
the step of calculating the second placement portion rotation position includes rotating the arm reference line located at the first arm rotation position about the robot reference axis and the substrate placement portion located at the first placement portion rotation position about the rotation axis, in the same rotation direction by the same rotation angle, to search for two rotation positions at which the index lengths are equal, and setting a center rotation position between the two rotation positions as the second placement portion rotation position.

6. The substrate placement portion rotation axis searching method according to claim 1, wherein
the step of calculating the second placement portion rotation position includes rotating the arm reference line located at the first arm rotation position about the robot reference axis and the substrate placement portion located at the first placement portion rotation position about the rotation axis, in the same rotation direction by the same rotation angle, to search for a rotation position at which the index length is maximized, and setting the rotation position as the second placement portion rotation position.

7. The substrate placement portion rotation axis searching method according to claim 1, wherein
the arm reference line connects the distal end of the robot arm, at which the detection line is provided, and the robot reference axis.

8. A substrate transfer apparatus comprising:
a substrate transfer robot provided with a robot reference axis and having an object detection sensor for detecting a target obstructing a detection line, and a robot arm for moving the object detection sensor in a plane perpendicular to an axial direction of the robot reference axis;
a substrate placement portion having the target to be detected by the object detection sensor, the substrate placement portion being configured to rotate about a rotation axis extending in parallel to the axial direction; and
a controller configured to control operations of the substrate transfer robot and the substrate placement portion, wherein
the controller
detects the target by the object detection sensor at a plurality of rotation positions of the substrate placement portion, and calculates an index length which is a distance from the robot reference axis to the target in a direction perpendicular to the axial direction, or information correlated therewith,
on the basis of the calculated index length or the calculated information correlated therewith, calculates at least one of a rotation position of the detection line about the robot reference axis and a rotation position of the substrate placement portion about the rotation axis when the target located on a line connecting the robot reference axis and the rotation axis is detected, and
specifies a direction in which the rotation axis is present as seen from the robot reference axis, on the basis of the calculated rotation position,
a line perpendicular to the axial direction and passing a distal end of the robot arm to which the object detection sensor is connected and the robot reference axis is defined as an arm reference line, and a line perpendicular to the axial direction and passing the rotation axis and the target is defined as a placement portion reference line, and
the controller
calculates a first placement portion rotation position of the placement portion reference line about the rotation axis and a first arm rotation position of the arm reference line about the robot reference axis at which the placement portion reference line and the arm reference line are parallel to each other;
calculates a second placement portion rotation position of the arm reference line reference line and a second arm rotation position of the arm reference line at which an extending direction of the placement portion reference line and an extending direction of the arm reference line coincide with each other, by rotating the placement portion reference line located at the first placement portion rotation position and the arm reference line located at the first arm rotation position in the same direction by same rotation angle,
moves the placement portion reference line to the first placement portion on rotation position and moves the arm reference line to the first arm rotation position.
moves the placement portion reference line from the first placement portion rotation position to the second placement portion rotation position and moves the arm reference line from the first arm rotation position to the second arm rotation position, and
stores a rotation position of a joint of the robot arm when the arm reference line is at the second arm rotation position.

9. The substrate transfer apparatus according to claim 8, wherein
the controller calculates a distance from the robot reference axis to the rotation axis on the basis of the index length when the target located at the line connecting the robot reference axis and the rotation axis is detected, and a known distance from the rotation axis to the target.

10. The substrate transfer apparatus according to claim 8, wherein
the controller operates the substrate transfer robot and the substrate placement portion so as to search for two rotation positions of the placement portion reference line at which the index lengths are equal, while keeping the arm reference line at the first arm rotation position, and sets a center rotation position between the two rotation positions as the first placement portion rotation position.

11. The substrate transfer apparatus according to claim 8, wherein
the controller operates the substrate transfer robot and the substrate placement portion so as to search for a rotation position of the placement portion reference line at which the index length is minimized, while keeping the arm reference line at the first arm rotation position, and sets the rotation position as the first placement portion rotation position.

12. The substrate transfer apparatus according to claim 8, wherein
the controller operates the substrate transfer robot and the substrate placement portion so as to rotate the arm reference line located at the first arm rotation position about the robot reference axis and the substrate placement portion located at the first placement portion rotation position about the rotation axis, in the same rotation direction by the same rotation angle, to search for two rotation positions at which the index lengths are equal, and sets a center rotation position between the two rotation positions as the second placement portion rotation position.

13. The substrate transfer apparatus according to claim 8, wherein
the controller operates the substrate transfer robot and the substrate placement portion so as to rotate the arm reference line located at the first arm rotation position about the robot reference axis and the substrate placement portion located at the first placement portion rotation position about the rotation axis, in the same rotation direction by the same rotation angle, to search for a rotation position at which the index length is maximized, and sets the rotation position as the second placement portion rotation position.

14. A substrate transfer apparatus comprising:
a substrate transfer robot provided with a robot reference axis and having an object detection sensor for detecting a target obstructing a detection line, and a robot arm for moving the object detection sensor in a plane perpendicular to an axial direction of the robot reference axis;
a substrate placement portion having the target to be detected by the object detection sensor, the substrate placement portion being configured to rotate about a rotation axis extending in parallel to the axial direction; and
a controller configured to control operations of the substrate transfer robot and the substrate placement portion, wherein
the controller
detects the target by the object detection sensor at a plurality of rotation positions of the substrate placement portion, and calculates an index length which is a distance from the robot reference axis to the target in a direction perpendicular to the axial direction, or information correlated therewith,
on the basis of the calculated index length or the calculated information correlated therewith, calculates at least one of a rotation position of the detection line about the robot reference axis and a rotation position of the substrate placement portion about the rotation axis when the target located on a line connecting the robot reference axis and the rotation axis is detected, and
specifies a direction in which the rotation axis is present as seen from the robot reference axis, on the basis of the calculated rotation position,
a line perpendicular to the axial direction and passing a distal end of the robot arm to which the object detection sensor is connected and the robot reference axis is defined as an arm reference line, and a line perpendicular to the axial direction and passing the rotation axis and the target is defined as a placement portion reference line, and
the controller
calculates a first placement portion rotation position of the placement portion reference line about the rotation axis and a first arm rotation position of the arm reference line about the robot reference axis at which the placement portion reference line and the arm reference line are parallel to each other,
calculates a second placement portion rotation position of the placement portion reference line and a second arm rotation position of the arm reference line at which an extending direction of the placement portion reference line and an extending direction of the arm reference line coincide with each other, by rotating the placement portion reference line located at the first placement portion rotation position and the arm reference line located at the first arm rotation position in the same direction by the same rotation angle, and
operates the substrate transfer robot and the substrate placement portion so as to rotate the arm reference line located at the first arm rotation position about the robot reference axis and the substrate placement portion located at the first placement portion rotation position about the rotation axis, in the same rotation direction by the same rotation angle, to search for two rotation positions at which the index lengths are equal, and sets a center rotation position between the two rotation positions as the second placement portion rotation position.

* * * * *